United States Patent
Cao et al.

(10) Patent No.: US 11,985,817 B2
(45) Date of Patent: May 14, 2024

(54) SEMICONDUCTOR DEVICE AND FORMING METHOD THEREOF

(71) Applicant: CHANGXIN MEMORY TECHNOLOGIES, INC., Hefei (CN)

(72) Inventors: Kai Cao, Hefei (CN); Liang Zhao, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 210 days.

(21) Appl. No.: 17/599,746

(22) PCT Filed: Apr. 12, 2021

(86) PCT No.: PCT/CN2021/086463
§ 371 (c)(1),
(2) Date: Sep. 29, 2021

(87) PCT Pub. No.: WO2021/204290
PCT Pub. Date: Oct. 14, 2021

(65) Prior Publication Data
US 2023/0053500 A1    Feb. 23, 2023

(30) Foreign Application Priority Data
Apr. 10, 2020 (CN) .......................... 202010280153.1

(51) Int. Cl.
*H10B 12/00* (2023.01)
*H01L 21/66* (2006.01)
(52) U.S. Cl.
CPC ........... *H10B 12/485* (2023.02); *H01L 22/00* (2013.01); *H01L 22/32* (2013.01);
(Continued)

(58) Field of Classification Search
CPC ......... H01L 21/48; H01L 22/00; H01L 22/32; H01L 23/488; H10B 12/00;
(Continued)

(56) References Cited

U.S. PATENT DOCUMENTS 6,271,099 B1    8/2001 Lou
7,335,590 B2    2/2008 Suh et al.
(Continued)

FOREIGN PATENT DOCUMENTS

CN    1674251 A    9/2005
CN    108695326 A    10/2018
(Continued)

OTHER PUBLICATIONS

First CN Office Action cited in CN202010280153.1, dated May 24, 2023, 10 pages.
(Continued)

*Primary Examiner* — Meiya Li
(74) *Attorney, Agent, or Firm* — Cooper Legal Group, LLC

(57) ABSTRACT

The present disclosure relates to a semiconductor device and a forming method thereof. The forming method includes: providing a substrate; forming node contacts inside the substrate; forming landing pads on an upper surface of the substrate, where the landing pad is in contact with the node contact; forming a barrier layer on exposed surfaces of the landing pads and the node contacts; and after performing an electrical test on the semiconductor device on which the barrier layer is formed, removing the barrier layer on an upper surface of the landing pads.

7 Claims, 4 Drawing Sheets

(52) U.S. Cl.
CPC ....... *H10B 12/0335* (2023.02); *H10B 12/315* (2023.02); *H10B 12/482* (2023.02)

(58) Field of Classification Search
CPC .............. H10B 12/0335; H10B 12/315; H10B 12/482; H10B 12/485
See application file for complete search history.

(56) References Cited

U.S. PATENT DOCUMENTS

| | | |
|---|---|---|
| 10,373,960 B2 | 8/2019 | Kim et al. |
| 2006/0097390 A1 | 5/2006 | Nam et al. |
| 2007/0155150 A1 | 7/2007 | Kim |
| 2009/0289292 A1 | 11/2009 | Park |
| 2014/0264908 A1 | 9/2014 | Lee et al. |
| 2015/0061134 A1* | 3/2015 | Lee ........................ H10B 12/34 257/751 |
| 2019/0157273 A1 | 5/2019 | Kim et al. |
| 2020/0203354 A1 | 6/2020 | Lee et al. |

FOREIGN PATENT DOCUMENTS

| | | |
|---|---|---|
| CN | 111354711 A | 6/2020 |
| KR | 20040092021 A | 11/2004 |

OTHER PUBLICATIONS

International Search report and English Translation cited in PCT/CN2021/086463, dated Jul. 21, 2021, 15 pages.

* cited by examiner

SEMICONDUCTOR DEVICE AND FORMING METHOD THEREOF

CROSS REFERENCE TO RELATED APPLICATION

The present disclosure claims the benefit and priority of Chinese Patent Application No. 202010280153.1, filed on Apr. 10, 2020 and entitled "SEMICONDUCTOR DEVICE AND FORMING METHOD THEREOF", the disclosure of which is incorporated by reference herein in its entirety as part of the present disclosure.

TECHNICAL FIELD

The present disclosure relates to the field of semiconductor production and processing, in particular to a semiconductor device and a forming method thereof.

BACKGROUND

In current semiconductor devices, such as semiconductor memory, tungsten (W) is often used as a material for the node contact (NC) and the landing pad. After the NC and landing pad are formed on the semiconductor device, a wafer acceptance test (WAT) at high temperatures is usually performed on the semiconductor device. In this step, short circuits often occur between the NCs, causing the semiconductor memory to fail, and seriously affecting the yield of the semiconductor memory.

In order to improve the yield of the semiconductor device, there is an urgent need to improve the structure of the semiconductor device, so as to prevent the NCs from short-circuiting to cause failure of the semiconductor device.

SUMMARY

An objective of the present disclosure is to provide a semiconductor device and a forming method thereof. The present disclosure can effectively prevent node contacts (NCs) from short-circuiting to cause failure of the semiconductor device, thereby improving the yield of the semiconductor device.

In order to solve the above technical problem, the present disclosure provides a forming method of a semiconductor device. The forming method comprises: providing a substrate; forming node contacts inside the substrate; forming landing pads on an upper surface of the substrate, where the landing pad is in contact with the node contacts; forming a barrier layer on exposed surfaces of the landing pads and the NC; and after performing an electrical test on the semiconductor device on which the barrier layer is formed, removing the barrier layer on an upper surface of the landing pads.

In order to solve the above technical problem, the present disclosure further provides a semiconductor device. The semiconductor device comprises: a substrate; a landing pad formed on a surface of the substrate; a node contact formed inside the substrate, where the landing pad is partially in contact with the node contact; and a barrier layer formed on exposed surfaces of the landing pad and the node contact.

In order to solve the above technical problem, the present disclosure may further provide a semiconductor device. The semiconductor device may comprise: a substrate; a plurality of landing pads formed on a surface of the substrate; a plurality of node contacts formed inside the substrate, where the landing pads and the node contacts are connected in a one-to-one correspondence; barrier layers formed on sidewall surfaces of the landing pads and exposed surfaces of the node contacts; and a gap filler formed between the landing pads.

In the semiconductor device and the forming method thereof provided by the present disclosure, a barrier layer is formed on the surface of the landing pad. It can effectively prevent the metal diffusion of the landing pad and the node contact during the electrical test of the semiconductor device, and prevent the landing pad and the node contact from short-circuiting after the electrical test, thereby improving the performance of the semiconductor device.

BRIEF DESCRIPTION OF THE DRAWINGS

To describe the technical solutions in the embodiments of the present disclosure more clearly, the accompanying drawings required to describe the embodiments are briefly described below. Apparently, the accompanying drawings described below are only some embodiments of the present disclosure. A person of ordinary skill in the art may further obtain other accompanying drawings based on these accompanying drawings without creative efforts.

DETAILED DESCRIPTION

Research has found that short circuits often occur between node contacts (NCs) during a wafer acceptance test (WAT) at high temperatures. The reason is that the metal atoms of the NC and the landing pad easily diffuse between the NCs during the WAT at high temperatures. Since the conductive metal oxide appears between the NCs, the different NCs are connected to each other, and short-circuit during the electrical test, which causes the memory device to be damaged.

To make the objectives, technical means and effects of the present disclosure clearer, the present disclosure is described in further detail below with reference to the accompanying drawings. It should be understood that the embodiments described herein are merely a part rather than all of the embodiments of the present disclosure, and are not intended to limit the present disclosure. All other embodiments obtained by those of ordinary skill in the art based on the embodiments of the present disclosure without creative efforts should fall within the protection scope of the present disclosure.

Figure 1A:
FIGS. 1a to 1l are schematic structural diagrams of a semiconductor device corresponding to various steps of a forming method of a semiconductor device according to an embodiment of the present disclosure.
Figure 1B:
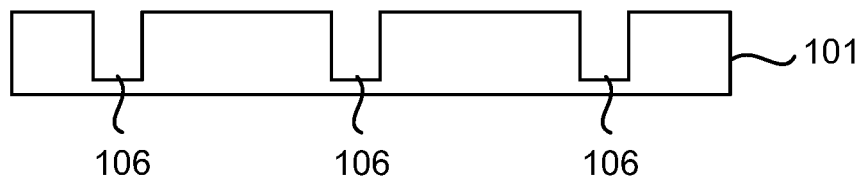
Figure 1C:
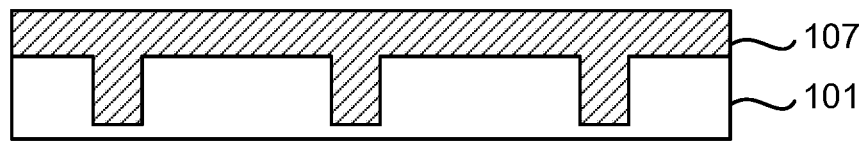
Figure 1D:
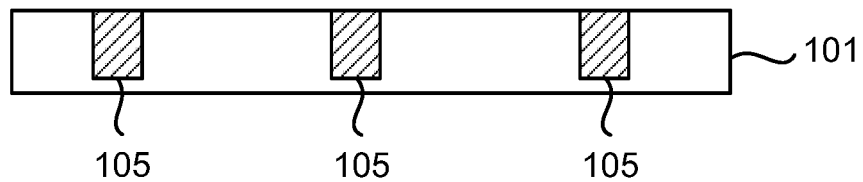
Figure 4:
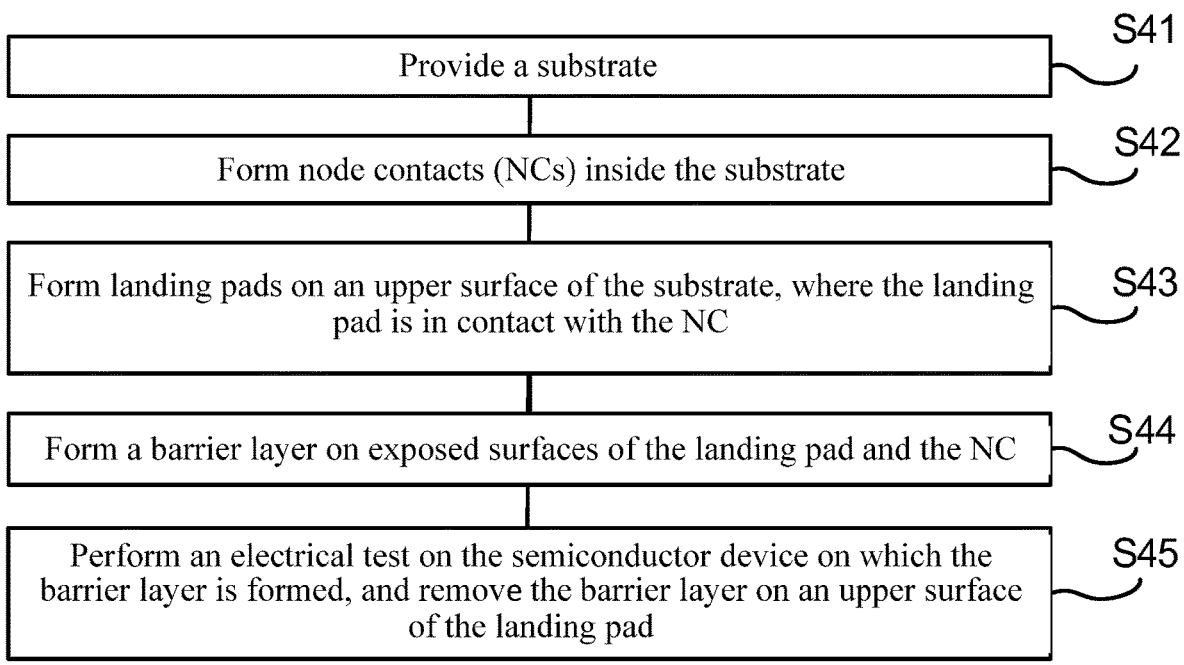
FIG. 4 is a flowchart of a forming method of a semiconductor device according to an embodiment of the present disclosure.

Referring to FIGS. 1a to 1l, FIG. 2 and FIG. 4, FIGS. 1a to 1l are schematic structural diagrams of a semiconductor device corresponding to various steps of a forming method of a semiconductor device according to an embodiment of the present disclosure; FIG. 2 is a partial enlarged view of a semiconductor device according to an embodiment of the present disclosure; FIG. 4 is a flowchart of a forming method of a semiconductor device according to an embodiment of the present disclosure.

An embodiment of the present disclosure provides a forming method of a semiconductor device. As shown in FIGS. 1a to 1l, the forming method includes the following steps. S41: Provide a substrate 101, as shown in FIG. 1a. S42: Form NCs 105 inside the substrate 101, as shown in FIG. 1d. S43: Form landing pads 108 on an upper surface of the substrate 101, where the landing pad 108 is in contact with the NC 105, as shown in FIG. 1h. S44: Form a barrier layer 109 on an upper surface of the landing pad 108 and an exposed surface of the NC 105, as shown in FIGS. 1i and 2. S45: Perform an electrical test on the semiconductor device on which the barrier layer 109 is formed to an electrical test, and then remove the barrier layer 109 on the upper surface of the landing pad 108, as shown in FIG. 1k.

In this embodiment, the forming method of a semiconductor device forms a barrier layer 109 on the surface of the landing pad 108 and the exposed surface of the NC 105. During the electrical test of the semiconductor device, the barrier layer 109 can effectively prevent conductive metal atoms from diffusing to the substrate 101 from outer walls of the landing pad 108 and the NC 105. Therefore, the forming method of a semiconductor device can prevent a landing pad 108 and an NC 105 on the surface of the substrate 101 from short-circuiting with other landing pad 108 and other NC 105 during the electrical test. The forming method of a semiconductor device improves the performance of the semiconductor device, and improves the yield of a memory produced with the semiconductor device.

Referring to FIGS. 1a to 1l and FIG. 2, the NC 105 also has an exposed area, and the barrier layer 109 is also formed on the surface of the exposed area of the NC 105.

In an embodiment, the NC 105 is formed of a conductive material, including at least one from the group consisting of metal, metal silicide and impurity-doped polycrystalline silicon.

In an embodiment, the NC 105 includes at least one from the group consisting of a tungsten NC, a copper NC, an aluminum NC and a titanium NC; the landing pad 108 includes at least one from the group consisting of a tungsten landing pad 108, a copper landing pad 108, an aluminum landing pad 108 and a titanium landing pad 108. In the embodiment shown in FIGS. 1a to 1l, the landing pad 108 and the NC 105 are respectively composed of tungsten.

In an embodiment, the substrate 101 may be at least one from the group consisting of a bulk silicon substrate, a silicon-on-insulator (SOI) substrate, a germanium substrate, a germanium-on-insulator (GOI) substrate and a silicon germanium substrate. In fact, the specific structure of the substrate 101 may be selected according to needs.

In an embodiment, the semiconductor device includes, but is not limited to, a dynamic random access memory (DRAM). In this embodiment, bit line structures are provided on the surface of the substrate 101, and word line structures are provided inside the substrate 101. The NC 105 is provided between two adjacent bit line structures and between two adjacent word line structures.

In an embodiment, bit line structures and a spacer layer formed between the bit line structures are provided on the surface of the substrate 101. The forming NCs 105 inside the substrate 101 includes: provide an opening 106 in the spacer layer, where the opening 106 extends downward in a direction perpendicular to the upper surface of the substrate 101, as shown in FIG. 1B; fill the opening 106 with a conductive metal until a first conductive metal layer 107 is formed to cover the upper surface of the substrate 101, as shown in FIG. 1c; and planarize the first conductive metal layer 107 until an upper surface of the first conductive metal layer 107 is flush with upper surfaces of the bit line structures, as shown in FIG. 1d.

In this embodiment, when the opening 106 is provided on the upper surface of the substrate 101, the opening 106 is provided in the spacer layer between the bit line structures and between two adjacent word line structures.

In this embodiment, a height of a bottom surface of the opening 106 is greater than a height of a bottom surface of a source/drain in the semiconductor structure, and may be smaller than a height of a bottom surface of the bit line structure.

In an embodiment, there are a plurality of NCs 105 inside the substrate 101. Therefore, a plurality of openings 106 having the same number as a preset number of the NCs 105 need to be provided on the upper surface of the substrate 101. In this embodiment, a number of the landing pads 108 is equal to the number of the NCs 105 inside the substrate 101, and the landing pads 108 are connected to the NCs 105 in a one-to-one correspondence. Before removing the barrier layers 109 on upper surfaces of the landing pads 108, the forming method further includes: fill a gap filler 110 between the plurality of landing pads 108 such that the gap filler 110 covers the barrier layers 109 on the upper surfaces of the landing pads 108, as shown in FIG. 1j.

In this embodiment, the landing pads 108 are separated from each other by the gap filler 110. In the direction perpendicular to the substrate 101, a center of the landing pad 108 and a center of the NC 105 connected to the landing pad 108 do not overlap. That is, the position of the landing pad 108 and the position of the NC 105 are staggered, as shown in FIGS. 1h to 1l. In this way, when cylindrical capacitors 111 are formed on the upper surfaces of the landing pads 108, the cylindrical capacitors 111 are in a hexagonal arrangement on the surface of the substrate 101. In this embodiment, the cylindrical capacitor 111 includes a bottom electrode, a dielectric layer and a top electrode stacked in sequence. The bottom electrode is provided close to the surface of the landing pad 108, as shown in FIG. 1l.

In an embodiment, the barrier layer 109 includes a nitride layer. The nitride layer is formed as follows: perform nitriding treatment on the landing pad 108 by introducing a reactive gas to form a nitride layer on the exposed surfaces of the landing pad 108 and the NC 105, where the reactive gas includes a nitrogen-containing gas.

In this embodiment, a dense metal nitride layer is formed on the exposed surfaces of the landing pad 108 and the NC 105. It can effectively prevent conductive metal atoms from diffusing into the substrate 101 to connect the NCs 105 from the outer surfaces of the landing pad 108 and the NC 105, reducing the possibility of short-circuiting between the NCs 105 during the WAT. In an embodiment, when the landing pad is made of tungsten, the metal nitride layer includes a tungsten nitride layer.

In an embodiment, the reactive gas includes a mixed gas of nitrogen and hydrogen. In the mixed gas, nitrogen occupies about 95% to 100%, and hydrogen occupies about 0% to 5%. The thickness of the formed nitride layer is about 2 Å to 15 Å, for example, it may be 10 Å. In fact, the reactive gas may be selected according to needs, and it may be ammonia, high-purity nitrogen, or a mixture of ammonia, nitrogen and hydrogen.

In some other embodiments, other dense barrier layer 109, such as a silicon nitride layer, may also be formed on the exposed surfaces of the landing pad 108 and the NC to prevent the metal atoms on the surfaces of the landing pad 108 and the NC 105 from diffusing into the substrate 101 to cause adjacent NCs 105 to short-circuit during the electrical test. The forming method of the barrier layer 109 also changes with the material of the barrier layer 109 changed.

In an embodiment, the removing the barrier layer 109 on an upper surface of the landing pad 108 includes: performing chemical mechanical polishing (CMP) on the gap filler 110 until the barrier layer 109 on the upper surface of the landing pad 108 is removed and the upper surface of the landing pad 108 is exposed.

In another embodiment, the removing the barrier layer 109 on an upper surface of the landing pad 108 includes: etch the gap filler 110 until the barrier layer 109 is exposed, and etch the barrier layer 109 until the barrier layer 109 on the upper surface of the landing pad 108 is removed and the upper surface of the landing pad 108 is exposed.

In an embodiment, the gap filler 110 includes nitride, such as silicon nitride. In fact, the specific type of the gap filler 110 may be selected according to needs.

Figure 3:
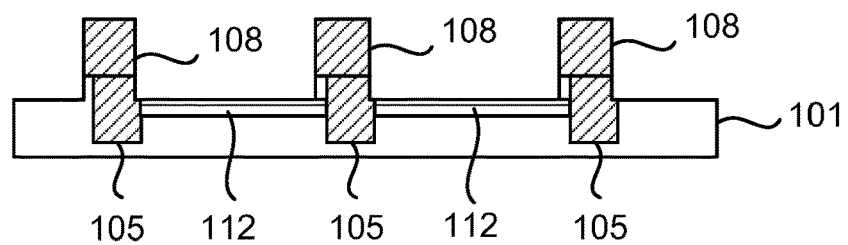
FIG. 3 is a schematic structural diagram of a semiconductor device free of a barrier layer according to an embodiment of the present disclosure.

In an embodiment, the electrical test includes a WAT at a high temperature ranging from 90° C. to 110° C. In this temperature range of 90° C. to 110° C., the metal atoms in the landing pad 108 and the NC 105 are more likely to diffuse outward. Therefore, a sufficiently thick barrier layer 109 may be provided to prevent the metal atoms in the landing pad 108 and the NC 105 from diffusing out at high temperatures. Referring to FIG. 3, FIG. 3 is a schematic diagram of a short circuit between two adjacent NCs 105 when there is no barrier layer 109. There is a connecting wire 112 made of a metal oxide between two adjacent NCs. Once an electrical test is performed, the NCs that are connected to each other will short-circuit.

Figure 1E:
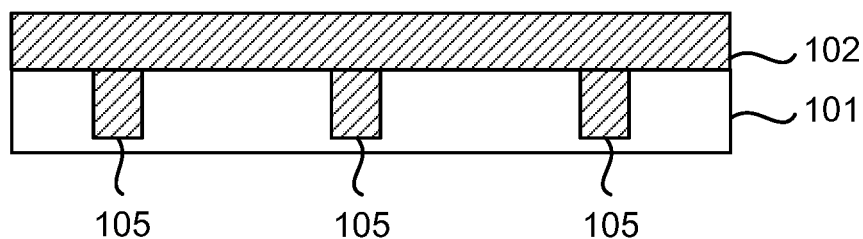
Figure 1F:
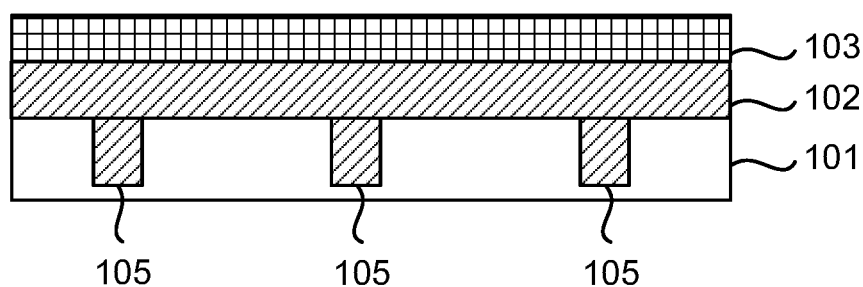
Figure 1G:
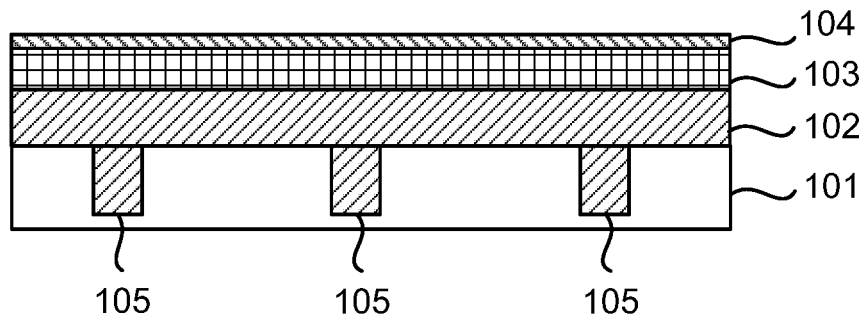
Figure 1H:
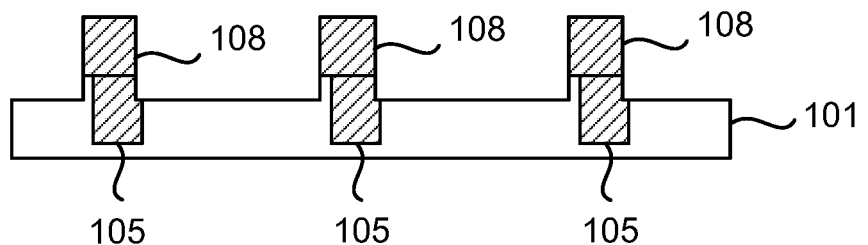
Figure 1I:
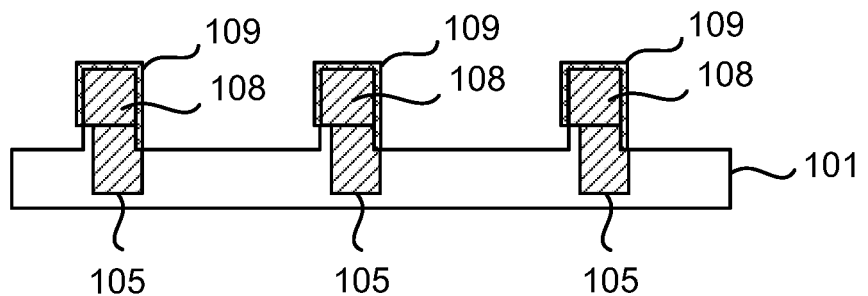
Figure 1J:
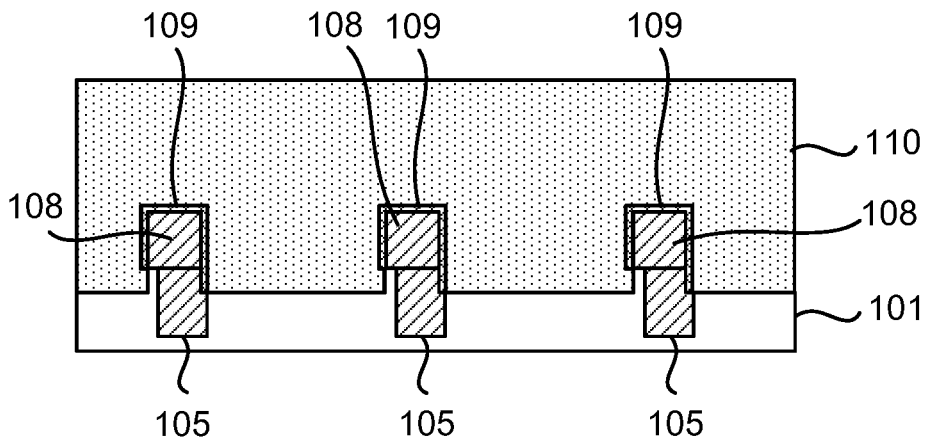
Figure 1K:
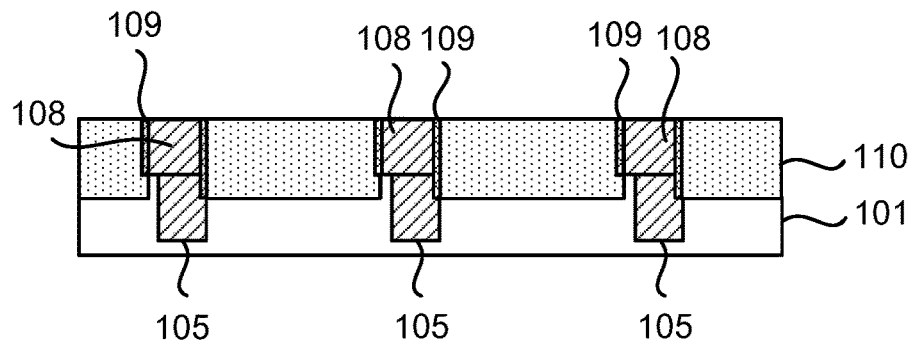
Figure 1L:
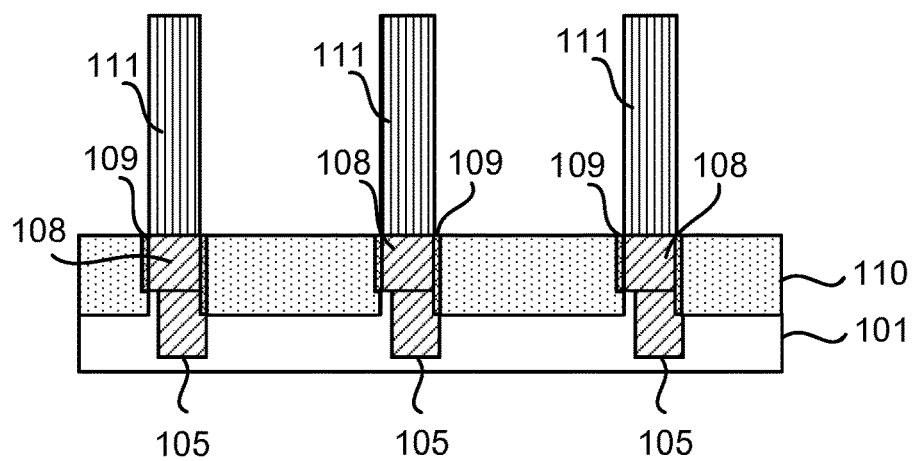
Figure 2:
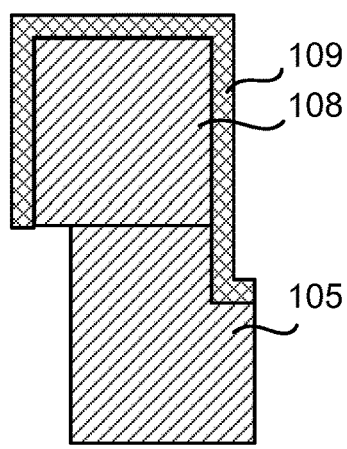
FIG. 2 is a partial enlarged view of a semiconductor device according to an embodiment of the present disclosure.

In an embodiment, the forming landing pads 108 on an upper surface of the substrate 101 includes: form a second conductive metal layer 102 on the upper surface of the first conductive metal layer 107, as shown in FIG. 1e; form a mask layer 103 on an upper surface of the second conductive metal layer 102, as shown in FIG. 1f; pattern the mask layer 103, where a pattern formed by the patterning the mask layer 103 is the same as a preset pattern of the landing pad 108; directionally etch the second conductive metal layer 102 exposed after the patterning the mask layer 103, where an etching direction is perpendicular to the upper surface of the substrate 101, and an etching depth is greater than or equal to a height of the second conductive metal layer 102 in the direction perpendicular to the upper surface of the substrate 101, as shown in FIG. 1h; and remove the mask layer 103.

In this embodiment, the mask layer 103 may be amorphous carbon (aC) or spin-on carbon (SOC), but is not limited thereto. When the second conductive metal layer 102 exposed after the patterning the mask layer 103 is directionally etched, the etching depth is greater than or equal to the height of the second conductive metal layer 102 in a direction perpendicular to the upper surface of the substrate 101, and the second conductive metal layer 102 is etched until the upper surface of the substrate 101 is exposed.

In an embodiment, the pattern formed by the patterning the mask layer 103 partially overlaps with a projection of the NC 105 on the upper surface of the mask layer 103, and the centers do not overlap. In this way, the center of the landing pad 108 does not overlap with the center of the NC 105 connected to the landing pad 108, that is, the position of the landing pad 108 and the position of the NC 105 are staggered. In this embodiment, when the second conductive metal layer 102 is etched, the etching depth is greater than the height of the second conductive metal layer 102 in a direction perpendicular to the surface of the substrate 101, such that a part of a sidewall of the substrate 101 is exposed, and a part of the first conductive metal layer 107 is etched away.

In an embodiment, before patterning the mask layer 103, the forming method further includes: form an anti-reflection layer 104 on an upper surface of the mask layer 103, where the anti-reflection layer 104 includes a silicon oxynitride layer, as shown in FIG. 1g. The anti-reflection layer 104 is formed to achieve a better patterning effect when the mask layer 103 is patterned.

This embodiment further provides a semiconductor device. Referring to FIGS. 1i and 2, the semiconductor device includes: a substrate 101; landing pads 108 formed on a surface of the substrate 101; NCs 105 formed inside the substrate 101, where the landing pads 108 are connected to the NCs 105 in a one-to-one correspondence; and a barrier layer 109 formed on exposed surfaces of the landing pad 108 and the NC 105.

When an electrical test is performed on the semiconductor device with such a structure, it can effectively prevent conductive metal atoms from diffusing to the interior of the substrate 101 and the surface of the substrate 101 from the sidewalls and top surfaces of the landing pad 108 and the NC 105, so as to prevent an NC 105 from short-circuiting with an adjacent NC 105 during an electrical test. This embodiment improves the performance of the semiconductor device and improves the yield of other semiconductor devices fabricated based on the semiconductor device.

In an embodiment, the substrate 101 may be at least one from the group consisting of a bulk silicon substrate, an SOI substrate, a germanium substrate, a GOI substrate and a silicon germanium substrate. In fact, the specific structure of the substrate 101 may be selected according to needs.

In an embodiment, the NC 105 is formed of a conductive material, including at least one from the group consisting of metal, metal silicide and impurity-doped polycrystalline silicon. In the embodiment shown in FIGS. 1a to 1l, the landing pad 108 and the NC 105 are respectively composed of tungsten.

This embodiment further provides a semiconductor device. As shown in FIG. 1j, the semiconductor device includes: a substrate 101; a plurality of landing pads 108 formed on a surface of the substrate 101; a plurality of NCs 105 formed inside the substrate 101, where the landing pads 108 and the NCs 105 are connected in a one-to-one correspondence; a barrier layer 109 formed on a sidewall of the landing pad 108; and a gap filler 110 formed on sidewall surfaces of the landing pads 108 and exposed surfaces of the NCs 105, and a gap filler 110 formed between the landing pads.

When an electrical test is performed on the semiconductor device with such a structure, it can effectively prevent conductive metal atoms from diffusing to the interior of the substrate 101 and the surface of the substrate 101 from the sidewalls of the landing pad 108 and the NC 105, so as to prevent an NC 105 from short-circuiting with an adjacent NC 105 during an electrical test. This embodiment improves the performance of the semiconductor device and improves the yield of other semiconductor devices fabricated based on the semiconductor device.

In an embodiment, the substrate 101 may be at least one from the group consisting of a bulk silicon substrate, an SOI substrate, a germanium substrate, a GOI substrate and a silicon germanium substrate. In fact, the specific structure of the substrate 101 may be selected according to needs.

In an embodiment, the NC 105 is formed of a conductive material, including at least one from the group consisting of metal, metal silicide and impurity-doped polycrystalline silicon. In the embodiment shown in FIGS. 1*a* to 1*l*, the landing pad 108 and the NC 105 are respectively composed of tungsten.

In an embodiment, the gap filler 110 includes nitride. In fact, the gap filler 110 may be selected according to needs.

The above described are merely preferred implementations of the present disclosure. It should be noted that several improvements and replacements may further be made by those of ordinary skill in the art without departing from the principle of the present disclosure, but such improvements and replacements should also be deemed as falling within the protection scope of the present disclosure.

The invention claimed is:

1. A method of forming a semiconductor device, comprising:
   providing a substrate;
   forming node contacts inside the substrate;
   forming landing pads on an upper surface of the substrate, wherein each of the landing pads is in contact with one of the node contacts;
   forming a barrier layer on exposed surfaces of the landing pads and exposed surfaces of the node contacts; and
   after performing an electrical test on the semiconductor device on which the barrier layer is formed, removing the barrier layer on upper surfaces of the landing pads.

2. The method of claim 1, wherein the barrier layer comprises a nitride layer; the nitride layer is formed as follows:
   performing nitriding treatment on the landing pads by introducing a reactive gas to form the nitride layer on the exposed surfaces of the landing pads and the exposed surfaces of the node contacts, wherein the reactive gas comprises a nitrogen-containing gas.

3. The method of claim 1, wherein a number of the landing pads is equal to a number of the node contacts inside the substrate, and the landing pads are connected to the node contacts in a one-to-one correspondence; before removing the barrier layer on the upper surfaces of the landing pads, the method further comprises:
   filling a gap filler between the landing pads, the gap filler covers the barrier layer on the upper surfaces of the landing pads.

4. The method of claim 3, wherein removing the barrier layer on the upper surfaces of the landing pads comprises:
   performing chemical mechanical polishing on the gap filler until the barrier layer on the upper surfaces of the landing pads is removed and the upper surfaces of the landing pads are exposed.

5. The method of claim 3, wherein the removing the barrier layer on the upper surfaces of the landing pads comprises:
   etching the gap filler until the barrier layer is exposed; and
   etching the barrier layer until the barrier layer on the upper surfaces of the landing pads is removed and the upper surfaces of the landing pads are exposed.

6. The method of claim 1, wherein the electrical test comprises a wafer acceptance test at a temperature ranging from 90° C. to 110° C.

7. The method of claim 1, wherein the node contacts comprise at least one of the following: tungsten node contacts, copper node contacts, aluminum node contacts or titanium node contacts; and the landing pads comprise at least one of the following: tungsten landing pads, copper landing pads, aluminum landing pads or titanium landing pads.

* * * * *